(12) United States Patent
Meier

(10) Patent No.: US 7,709,749 B2
(45) Date of Patent: May 4, 2010

(54) HOUSING FOR SHIELDING FROM ELECTROMAGNETIC INTERFERENCE

(75) Inventor: Josef Meier, München (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 145 days.

(21) Appl. No.: 11/997,339

(22) PCT Filed: Nov. 8, 2006

(86) PCT No.: PCT/EP2006/010702

§ 371 (c)(1),
(2), (4) Date: Apr. 15, 2008

(87) PCT Pub. No.: WO2007/079808

PCT Pub. Date: Jul. 19, 2007

(65) Prior Publication Data

US 2008/0245561 A1    Oct. 9, 2008

(30) Foreign Application Priority Data

Dec. 21, 2005  (DE) .................. 10 2005 061 336

(51) Int. Cl.
  *H05K 9/00*   (2006.01)
(52) U.S. Cl. ................ 174/377; 174/382; 361/816
(58) Field of Classification Search ............ 174/377, 174/382, 372; 361/816, 818, 800
See application file for complete search history.

(56) References Cited

U.S. PATENT DOCUMENTS

| | | | | |
|---|---|---|---|---|
| 4,684,762 A | * | 8/1987 | Gladfelter | ................. 174/36 |
| 4,785,136 A | * | 11/1988 | Mollet et al. | ............ 174/363 |
| 5,136,119 A | | 8/1992 | Leyland | |
| 5,534,663 A | * | 7/1996 | Rivers et al. | ............. 174/363 |
| 5,545,844 A | | 8/1996 | Plummer, III et al. | |
| 6,040,878 A | * | 3/2000 | Jones | ..................... 348/819 |
| 6,288,329 B1 | | 9/2001 | Kopp et al. | |
| 6,359,213 B1 | * | 3/2002 | Long | ..................... 174/388 |
| 7,064,280 B1 | * | 6/2006 | Rodgers | ................ 174/384 |
| 2002/0104670 A1 | * | 8/2002 | Marmel | ................. 174/350 |
| 2004/0069515 A1 | | 4/2004 | Norte et al. | |

FOREIGN PATENT DOCUMENTS

| | | |
|---|---|---|
| DE | 3638123 | 5/1988 |
| DE | 4201296 | 7/1993 |
| DE | 19736026 | 8/1997 |
| WO | WO-02/47452 | 6/2002 |

OTHER PUBLICATIONS

International Search Report for PCT/EP2006/010702 dated Aug. 16, 2007.

* cited by examiner

*Primary Examiner*—Hung V Ngo
(74) *Attorney, Agent, or Firm*—Marshall, Gerstein & Borun LLP

(57) ABSTRACT

Housing for shielding from electromagnetic interference, comprising a first housing component with a first VELCRO-type fastening element and a second housing component with a second VELCRO-type fastening element each made of conductive material, wherein an aperture between the first housing component and the second housing component is closed in an electromagnetically-sealing manner by a third VELCRO-type fastening element made of conductive material.

13 Claims, 1 Drawing Sheet

HOUSING FOR SHIELDING FROM ELECTROMAGNETIC INTERFERENCE

BACKGROUND OF THE INVENTION

1. Field of the Invention

The present invention relates to a housing for shielding from electromagnetic interference.

2. Related Technology

A device for shielding electronic devices from field-bound electromagnetic interference for test purposes is known from DE 36 38 123 A1. The device consists of a flexible skin made of a conductive material adaptable in its shape to the device under test, which is impermeable to electromagnetic interference and enclosed on all sides, wherein this is preferably a metallized textile fabric. In this context, the skin enclosed on all sides provides a zip fastener or textile, VELCRO-type fastening.

Moreover, a two-part housing, of which the first housing component and the second housing component are attached to one another by a large number of screw connections, is conventional in practice. The disadvantage in this context consists in the awkwardness of the large number of screw connections, which are, indeed, mechanically stable, but costly to manufacture and to fasten. A further disadvantage is that a housing of this kind is not absolutely electromagnetically sealed, because apertures, which can be penetrated by electromagnetic radiation, are present between the individual screw connections. SUMMARY OF THE INVENTION The invention therefore provides a housing, of which the housing components are readily detachable in a non-destructive manner, wherein the connection between the housing components is absolutely electromagnetically sealed.

Accordingly, the invention provides a housing for shielding from electromagnetic interference, comprising a first housing component with a first VELCRO-type fastening element and a second housing component with a second VELCRO-type fastening element each made of conductive material, wherein an aperture between the first housing component and the second housing component is closed in an electromagnetically-sealing manner by means of a third VELCRO-type fastening element made of conductive material, which cooperates with the first VELCRO-type fastening element and the second VELCRO-type fastening element to form a VELCRO-type fastening.

In one embodiment, the invention comprises a housing for shielding from electromagnetic interference. The housing comprises a first housing component with a first VELCRO-type fastening element and a second housing component with a second VELCRO-type fastening element each comprising a conductive material, wherein an aperture between the first housing component and the second housing component is closed in an electromagnetically-sealing manner by means of a third VELCRO-type fastening element made of a conductive material.

One advantage of the housing according to the invention is that when the two housing components are fitted one above the other, the aperture resulting from manufacturing tolerances between the two housing components is closed in an electromagnetically-sealing manner, so that a good electromagnetic shielding with reference to the environment around the housing according to the invention is guaranteed within the housing according to the invention.

A further advantage of the housing according to the invention is that both the material of the first and the second housing component and also of the VELCRO-TYPE fastening elements can be made of metal, so that the housing is closed in an electromagnetically-sealing manner. An alternative, advantageous development of the housing according to the invention is to manufacture the VELCRO-TYPE fastening elements from conductive synthetic material.

Furthermore, it is advantageous that the two housing components can be detached from one another readily and in a non-destructive manner.

BRIEF DESCRIPTION OF THE DRAWING

An exemplary embodiment of the invention is described in greater detail below with reference to the drawings. The drawings are as follows.

DETAILED DESCRIPTION

Figure 1:
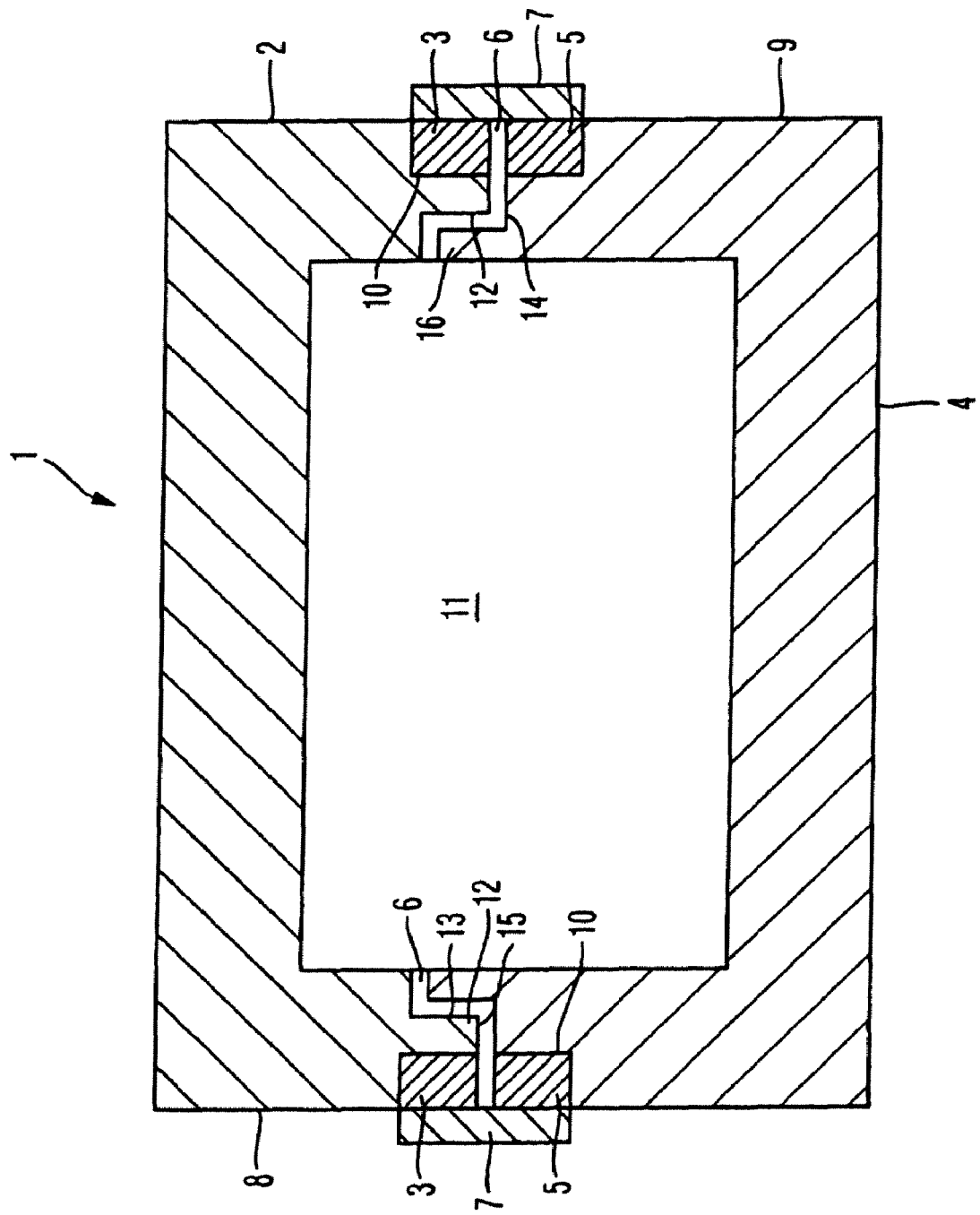
FIG. 1 shows a section through a housing according to the invention with three VELCRO-type fastening elements.

FIG. 1 shows a section through a housing 1 according to the invention with three VELCRO-type fastening elements 3, 5, 7. The housing 1 according to the invention for shielding from electromagnetic interference includes a first housing component 2 with a first VELCRO-type fastening element 3 and a second housing component 4 with a second VELCRO-type fastening element 5. The first and second VELCRO-type fastening elements 3, 5 are each made of conductive material, especially a metal or electrically-conductive synthetic material. As a result of manufacturing tolerances, when the two housing components 2, 4 are fitted one above the other, an aperture 6 is formed, which is permeable to electromagnetic radiation. This aperture 6 is closed in an electromagnetically-sealing manner by means of a third VELCRO-type fastening element 7 manufactured from a conductive material, thereby guaranteeing a good shielding of the interior 11 of the housing with regard to an environment of the housing 1 according to the invention.

The conductive material of the three VELCRO-type fastening elements 3, 5, 7 is either a metal or a conductive synthetic material.

The lateral walls 8, 9 of the first and second housing component 2, 4 can each provide a metallic layer with an enlarged surface area, which correspond to an adhesive layer of a VELCRO-type fastening element 3, 5, wherein the metallic layer with the enlarged surface area can be applied to the lateral walls 8, 9 of the first and second housing component 2, 4 by vapor deposition.

The third VELCRO-type fastening element 7 is provided as a connection between the first VELCRO-type fastening element 3 and the second VELCRO-type fastening element 5 and surrounds the point of contact 12 between the first and the second housing component 2, 4. The third VELCRO-type fastening element 7 is therefore designed to complement the first and second VELCRO-type fastening element 3, 5 as a counter element. For example, it provides hooks, while the first and second VELCRO-type fastening elements provide a felt, or vice versa.

In the exemplary embodiment, a peripheral groove 10 is provided at an outer end of one lateral wall 8, 9 of the first housing component 2 and of the second housing component 3. The housing 1 according to the invention is closed by fitting the first housing component 2 onto the second housing component 4.

The lateral walls 8, 9 of the first and second housing component 3, 4 in the exemplary embodiment each provide a peripheral recess 13, 14 on their upper side, wherein these recesses 13, 14 are designed to be complementary to one another. When the first housing component 2 is placed onto the second housing component 4, a projection 16 of the second housing component 4 fits into the recess 13 of the first housing component 2, so that the first housing component 2 is fitted onto the second housing component 4 in a stable manner and secured against slipping. A projection 15 of the first housing component 2 fits into the recess 14 of the second housing component 4, so that both housing components 2, 4 are disposed in close contact.

In each case, a VELCRO-type fastening element 3, 5 is inserted into the peripheral groove 10 of the two housing components, wherein the width of the VELCRO-type fastening element 3, 5 corresponds to the width of the groove 10, and is accordingly clamped firmly into the latter. The VELCRO-type fastening element 3, 5 can be glued, clamped, inserted or welded into the peripheral groove 10 of the first and second housing component 2, 4.

The third VELCRO-type fastening element 7 is placed over the VELCRO-type fastening elements 3, 5 inserted, glued, clamped or welded into the groove 10 in such manner that an aperture 6 at the point of contact 12 between the first and the second housing component 2, 4 is closed in an electromagnetically-sealing manner, wherein the VELCRO-type fastening element, 3, 5, 7 is preferably a continuous VELCRO-type fastening tape.

The invention is not restricted to the exemplary embodiment illustrated or to the exemplary embodiments described and may, for example, also be used to connect two housings to one another at the same time in a stable and reversible or non-destructive manner at a relatively low-cost.

The invention claimed is:

1. Housing for shielding from electromagnectic interference, comprising a first housing component with a first VELCRO-type fastening element and a second housing component with a second VELCRO-type fastening element, each fastening element made of conductive material, wherein an aperture defined between the first housing component and the second housing component is closed in an electromagnetically-sealing manner by a third VELCRO-type fastening element made of conductive material which cooperates with the first VELCRO-type fastening element and the second VELCRO-type fastening element to form a VELCRO-type fastening.

2. Housing according to claim 1, wherein
the conductive material of the VELCRO-type fastening elements is a metal.

3. Housing according to claim 1, wherein
lateral walls of the first and second housing component each provide a metallic layer with an enlarged surface area, which correspond with an adhesive layer of a VELCRO-type fastening element.

4. Housing according to claim 3, wherein
the metallic layer with an enlarged surface area is applied to the lateral walls of the first and second housing component by vapor deposition.

5. Housing according to claim 1, wherein
the third VELCRO-type fastening element is provided as a connection between the first VELCRO-type fastening element and the second VELCRO-type fastening element.

6. Housing according to claim 1, wherein
a peripheral groove is provided respectively at an external end of a lateral wall of each of the first housing component and the second housing component.

7. Housing according to claim 6, wherein
the first or second VELCRO-type fastening element is inserted respectively into the peripheral groove of the first and the second housing component.

8. Housing according to claim 6, wherein
the first or second VELCRO-type fastening element is attached respectively in the peripheral groove of the first and the second housing component by clamping.

9. Housing according to claim 6, wherein
the first or second VELCRO-type fastening element is glued respectively into the peripheral groove of the first and the second housing component.

10. Housing according to claim 6, wherein
the first or second VELCRO-type fastening element is welded respectively into the peripheral groove of the first and second housing component.

11. Housing according to claim 6, wherein
the third VELCRO-type fastening element is attached over first and second the VELCRO-type fastening elements inserted or respectively fitted into the grooves in such a manner that an aperture (6) at a point of contact between the first and second housing component is closed in an electromagnetically-sealing manner.

12. Housing according to claim 1, wherein
each VELCRO-type fastening element is a VELCRO-type fastening tape.

13. Housing according to claim 1, wherein
the conductive material for the VELCRO-type fastening element elements is a conductive synthetic material.

* * * * *